United States Patent
Le Ravalec et al.

(10) Patent No.: US 9,805,144 B2
(45) Date of Patent: Oct. 31, 2017

(54) METHOD FOR EXPLOITING A GEOLOGICAL RESERVOIR ON THE BASIS OF A RESERVOIR MODEL MATCHED BY MEANS OF MULTIPLE-SCALE PARAMETERIZATION

(71) Applicant: IFP Energies nouvelles, Rueil-Malmaison Cedex (FR)

(72) Inventors: Mickaele Le Ravalec, Rueil-Malmaison (FR); Caroline Gardet, Asnieres-sur-Seine (FR)

(73) Assignee: IFP ENERGIES NOUVELLES, Rueil-Malmaison (FR)

( * ) Notice: Subject to any disclaimer, the term of this patent is extended or adjusted under 35 U.S.C. 154(b) by 1127 days.

(21) Appl. No.: 13/923,484

(22) Filed: Jun. 21, 2013

(65) Prior Publication Data
US 2013/0346049 A1   Dec. 26, 2013

(30) Foreign Application Priority Data
Jun. 26, 2012   (FR) .................................... 12 01810

(51) Int. Cl.
G06G 7/48    (2006.01)
G06F 17/50   (2006.01)
G01V 99/00   (2009.01)

(52) U.S. Cl.
CPC ........ *G06F 17/5009* (2013.01); *G01V 99/005* (2013.01)

(58) Field of Classification Search
CPC .. G06F 17/5009; G01V 99/005; G01V 11/00; G01V 1/30
USPC ................................................. 703/10; 702/6
See application file for complete search history.

(56) References Cited

U.S. PATENT DOCUMENTS

| | | | | |
|---|---|---|---|---|
| 2003/0028325 A1* | 2/2003 | Roggero | ................ | G01V 11/00 702/11 |
| 2007/0055447 A1* | 3/2007 | Mickaele | ............. | G01V 99/005 702/7 |
| 2008/0243447 A1* | 10/2008 | Roggero | .................. | G01V 1/30 703/1 |

(Continued)

FOREIGN PATENT DOCUMENTS

| | | |
|---|---|---|
| EP | 1 637 904 A1 | 3/2006 |
| GB | 2 390 714 A | 1/2004 |

OTHER PUBLICATIONS

Emery "Simulation of geological domains using the plurigaussian model: New developments and computer programs". Computers & Geosciences vol. 33, Issue 9, Sep. 2007, pp. 1189-1201.*

(Continued)

*Primary Examiner* — Eunhee Kim
(74) *Attorney, Agent, or Firm* — Fitch, Even, Tabin & Flannery LLP

(57) ABSTRACT

The invention relates to a method for exploiting a geological reservoir which may be a reservoir storing gas (for example $CO_2$). The exploitation (EX) of the geological reservoir is carried out according to an exploitation scheme (SE) defined on the basis of a reservoir model (MR) with the reservoir model being matched (CAL) in relation to dynamic data (DD). According to the invention, the reservoir model (MR) is made representative by a multiple-scale parameterization, with at least two reservoir models (MR1, MR2) that have a different number of mesh cells.

46 Claims, 4 Drawing Sheets

(56) References Cited

U.S. PATENT DOCUMENTS

2011/0153285 A1* 6/2011 Da Veiga .............. G01V 11/00
                                                                                    703/1
2011/0308792 A1* 12/2011 Le Ravalec ............ G01V 11/00
                                                                                    166/250.01

OTHER PUBLICATIONS

Hu et al. "Combining the Pilot Point and Gradual Deformation Methods for Calibrating Permeability Models to Dynamic Data". Oil & Gas Science and Technology—Rev. IFP, vol. 62 (2007), No. 2, pp. 169-180.*
Mariethoz et al. "Collocated Co-Simulation Using Probability Aggregation". VIII Geostatistical Congress, Santiago, Chili Dec. 1-5, 2008. 9 Pages.*
Feraille et al. "Prediction under Uncertainty on a Mature Field". Oil & Gas Science and Technology—Rev. IFP Energies nouvelles, vol. 67 (Mar. 2012), No. 2, pp. 193-206.*
Hu "Gradual Deformation and Iterative Calibration of Gaussian-Related Stochastic Models". Mathematical Geology, vol. 32, No. 1, 2000. p. 87-108.*
Le Ravalec, M. et al: 2000, "The FFT Moving Average (FFT-MA) Generator: An Efficient Numerical Method for Generating and Conditioning Gaussian Simulations," Mathematical Geology, vol. 32, No. 6, pp. 701-723.
Ramarao, B., et al: "Pilot Point Methodology for Automated Calibration of an Ensemble of Conditionally Simulated Transmissivity Fields, 1. Theory and computational Experiments." Water Resources Research, vol. 31, No. 3, pp. 475-493.
Gomez-Hernandez, J., et al: "Stochastic Simulation of Transmissivity Fields Conditional to Both Transmissivity and Piezometric Data, 1. Theory," Journal of Hydrology, 203, (1997) p. 162-174.
Hu, L-Y., 2000, "Gradual Deformation and Iterative Calibration of Gaussian-Related Stochastic Models." In Mathematical Geology, vol. 32 No. (1), Jan. 2000, p. 87-108 (submitted corresponding pp. 1-32).
Caers, J.: "Geostatistical History Matching Under Training-Image Based Geological Model Constraints," SPE J. 8(3), 218-226 (submitted corresponding p. 1-39).
Tran, T.T. et al: 1999, "Efficient Conditioning of 3D Fine-Scale Reservoir Model to Multiphase Production Data Using Streamline-Based Coarse-Scale Inversion and Geostatistical Downscaling," SPE ATCE, Houston, TX, USA, SPE 56518, pp. 1-13.
Aanonsen, S.I., et al: 2006, "A Multiscale Method for Distributed Parameter Estimation with Application to Reservoir History Matching," Computational Geosciences., 10, pp. 97-117.

* cited by examiner

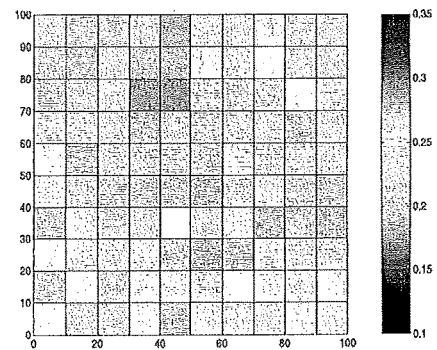
Figure 3a)
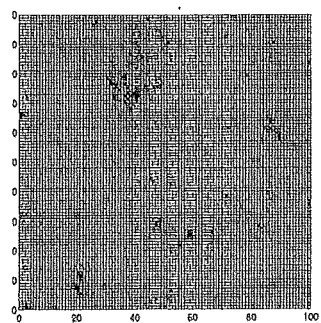 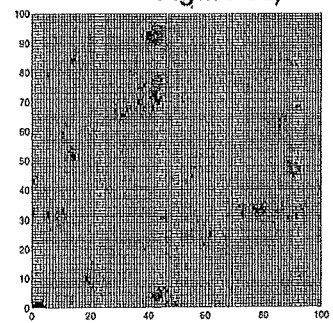 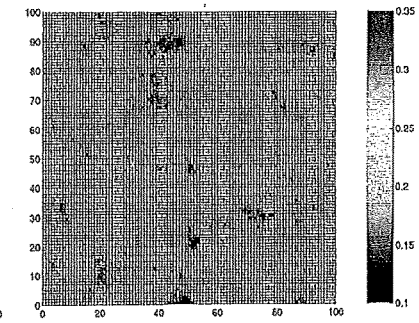
Figure 3b)     Figure 3c)     Figure 3d)
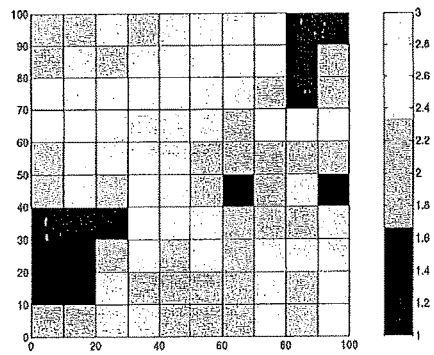
Figure 4a)
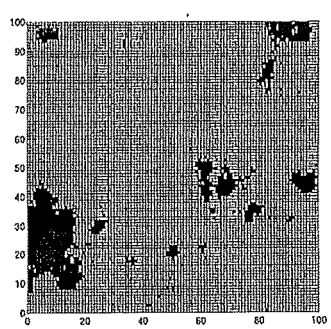 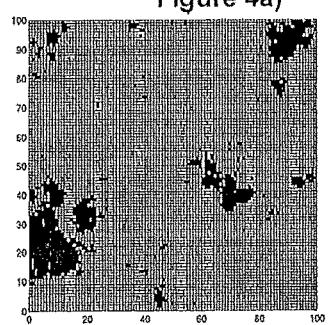 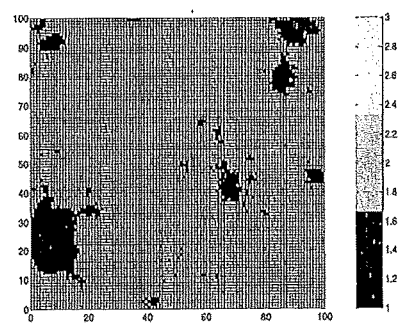
Figure 4b)     Figure 4c)     Figure 4d)

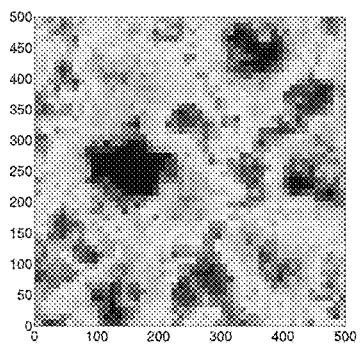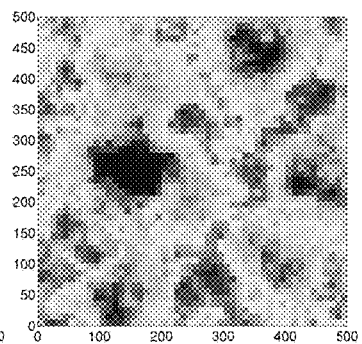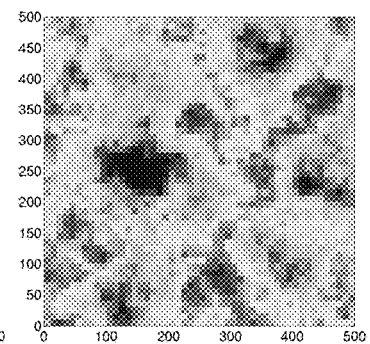
Figure 5a)  Figure 5b)  Figure 5c)
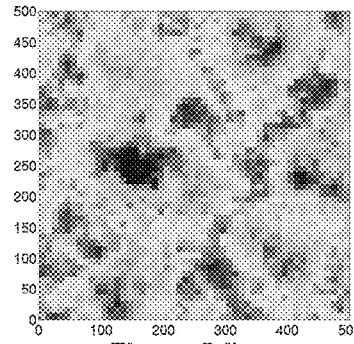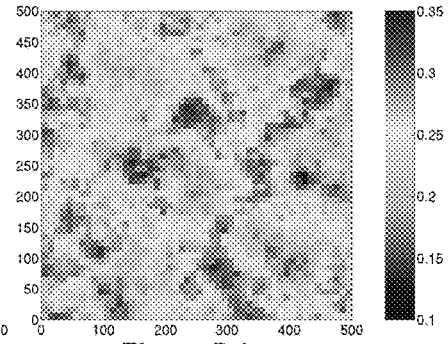
Figure 5d)  Figure 5e)

METHOD FOR EXPLOITING A GEOLOGICAL RESERVOIR ON THE BASIS OF A RESERVOIR MODEL MATCHED BY MEANS OF MULTIPLE-SCALE PARAMETERIZATION

CROSS-REFERENCE TO RELATED APPLICATION

Reference is made to French Application Serial No. 12/01810, filed Jun. 26, 2012, which application is incorporated herein by reference in its entirety.

BACKGROUND OF THE INVENTION

Field of the Invention

The present invention relates to the oil industry, and more particularly, to the exploitation of underground reservoirs, such as oil reservoirs or gas storage sites. In particular, the invention pertains to modification of representations of the reservoir, called reservoir models, to make them consistent with the various data collected in the field.

Description of the Prior Art

Optimizing and exploiting an oil deposit rely on a description that is as accurate as possible of the structure, of the petrophysical properties, of the fluid properties, etc., of the deposit being studied. For this, the experts use a computer tool which makes it possible to give an account of these aspects in an approximate manner known as the reservoir model. Such a model constitutes an experimental model of the subsoil, representative both of its structure and of its behavior. Generally, this type of experimental model is represented on a computer, and it is then called a numerical model. A reservoir model comprises a meshing or grid, generally three-dimensional, associated with one or more maps of petrophysical properties (facies, porosity, permeability, saturation, etc). The association assigns values of these petrophysical properties to each of the mesh cells of the grid.

These models, which are well known and widely used in the oil industry, make possible determination of numerous technical parameters relating to the study or exploitation of a reservoir, of hydrocarbons for example. In practice, since the reservoir model is representative of the structure of the reservoir and of its behavior, the engineer uses it for example to determine the areas which are most likely to contain hydrocarbons, the areas in which it may be advantageous/necessary to drill an injection or production well to improve the recovery of the hydrocarbons, the type of tools to be used, the properties of the fluids used and recovered, and so on. These interpretations of reservoir models in terms of "exploitation technical parameters" are well known to the experts. Similarly, the modeling of $CO_2$ storage sites makes it possible to monitor these sites, detect unexpected behaviors and predict the displacement of the injected $CO_2$.

The purpose of a reservoir model is therefore to give the best possible account of all the information that is known concerning a reservoir. A reservoir model is representative when a reservoir simulation provides numerical responses that are very close to the history data that have already been observed. The term "history data" is used to mean the production data obtained from measurements on the wells in response to the production of the reservoir (production of oil, production of water from one or more wells, gas/oil ratio (GOR), proportion of production water ("water cut"), and/or repetitive sismic data (4D sismic impedances in one or more regions, etc.). A reservoir simulation is a technique that makes it possible to simulate the flows of fluids within a reservoir with software called a "flow simulator."

For this, the integration of all the available data is essential. These data generally comprise:

measurements, at certain points of the geological formation, of the property being modeled, for example in wells. These data are called static because they do not vary in time (in the timescale of the production of the reservoir) and are directly linked to the property of interest.

"history data", comprising production data, for example the fluid flow rates measured on the wells, the concentrations of tracers and data obtained from sismic acquisition campaigns repeated at successive times. These data are called dynamic because they change during exploitation and are directly linked to the properties assigned to the mesh cells of the reservoir model.

The available static data are used to define random functions for each petrophysical property such as the porosity or the permeability. A representation of the spatial distribution of a petrophysical property is a realization of a random function. Generally, a realization is generated from, on the one hand, a mean, a variance and a covariance function which characterizes the spatial variability of the property being studied and, on the other hand, from a seed or from a series of random numbers. There are numerous simulation techniques in existence, such as the Gaussian sequential simulation method, the Cholesky method or even the FFT-MA (Fast Fourier transform with moving average) method. The following documents describe such methods:

Goovaerts, P., 1997, Geostatistics for Natural Resources Evaluation, Oxford Press, New York, 483 p.

Le Ravalec, M., Noetinger B., and Hu L.-Y., 2000, The FFT Moving Average (FFT-MA) Generator: An Efficient Numerical Method for Generating and Conditioning Gaussian Simulations, Mathematical Geology, 32(6), 701-723.

The techniques of integrating dynamic data (production and/or 4D sismic) in a reservoir model are well known to the experts: these are so-called "history-matching" techniques. History matching modifies the parameters of a reservoir model, such as the permeabilities, the porosities or the skins of wells (representing the damage around the well), the fault connections, and so on, to minimize the deviations between the measured history data and the corresponding responses simulated on the basis of the model by a flow simulator. The parameters may be linked to geographic regions such as the permeabilities or porosities around one or more wells. The deviation between the actual data and simulated responses forms a function, called objective function. The problem of history matching is resolved by minimizing this function. Reservoir model perturbation techniques make it possible to modify a realization of a random function while ensuring the fact that the perturbed realization is also a realization of this same random function. Perturbation techniques that can be cited include the pilot points method developed by RamaRao et al. (1995) and Gomez-Hernandez et al. (1997), the gradual deformations method proposed by Hu (2000) and the probability perturbation method introduced by Caers (2003). These methods make it possible to modify the spatial distribution of the heterogeneities:

RamaRao, B. S, Lavenue, A. M. Marsilly, G. de, Marietta, M. G., 1995, Pilot Point Methodology for Automated Calibration of An Ensemble of Conditionally Simulated Transmissivity Fields. 1. Theory and Computational Experiments. WRR, 31(3), 475-493.

Gomez-Hernandez, J., Sahuquillo, A., and Capilla, J. E., 1997, Stochastic Simulation of Transmissivity Fields Conditional to Both Transmissivity and Piezometric Data, 1. Theory, J. of Hydrology, 203, 162-174.

Hu, L-Y., 2000, Gradual Deformation and Iterative Calibration of Gaussian-Related Stochastic Models, Math. Geol., 32(1), 87-108.

Caers, J., 2003, Geostatistical History Matching Under Training Image Based Geological Constraints. SPE J. 8(3), 218-226.

The geological formations are very heterogeneous as a result of complex formation phenomena combining migration, erosion and deposition processes. It is thus possible to observe, on a large scale, beds, troughs, lobes, bars, meanders, and so on. Even within these geological objects, signs of heterogeneity are also manifest with, for example, lateral accretion phenomena or bundles with oblique layering. At the rock sample scale, the permeability varies also because of changes in the level of the contacts between grains, the size of the grains, the density of the cracks, and so on. Moreover, the static and dynamic data used to constrain the geological model are associated with different scales and with different levels of resolution. The measurements on samples make it possible to appreciate the heterogeneity to sub-centimetric scale, the diagraphies to the scale of ten or so centimeters and the production data to a scale comparable to the distance between wells. Consequently, to be representative of the geological reservoir, it is advantageous to use multiple-scale parameterization techniques, which makes it possible to make modifications to the geological model at different scales matched to the level of resolution of the information to be incorporated.

A first approach has been proposed to address this need. It involves the following steps: the generation of a fine-scale geological model, an "upscaling" of this model resulting in a coarse-scale reservoir model, the flow simulations and the resolution of the coarse-scale inversion problem, and finally a step of down-scaling, to transform the coarse reservoir model into a fine geological model. Such a method is described in the document:

Tran, T. T., Wen, X.-H., Behrens, R. A., 1999, Efficient Conditioning of 3D Fine-Scale Reservoir Model to Multiphase Production Data Using Streamline-Based Coarse-Scale Inversion and Geostatistical Downscaling, SPE ATCE, Houston, Tex., USA, SPE 56518.

Two points must be stressed. First of all, the process of scaling the permeabilities from the fine model to the coarse model, also called "upscaling", is based on an arithmetic mean, which is unsuited to permeabilities. Then, the coarse-scale matching step entails generating coarse-scale models which is done by considering an approximate variogram to describe the spatial variability of the permeability. It will be noted that the final step of downscaling from the coarse scale to the fine scale is performed either on the basis of a bayesienne approach, or on the basis of the Gaussian sequential simulation algorithm combined with cokriging. The major drawback with this method is that the fine-scale model obtained after matching is not in line with the dynamic data.

An interleaved matching approach has been put forward to correct this effect. This approach is described in the following document:

Aanonsen, S. I., Eydinova, D., 2006, A Multiscale Method for Distributed Parameter Estimation with Application to Reservoir History Matching, Comput. Geosci., 10, 97-117.

The model obtained after downscaling then has to be subjected to a new matching phase. There is then a first coarse-scale matching step with coarse-scale flow simulations and a second fine-scale matching step with fine-scale flow simulations. Consequently, the simulation time needed for this method is high. As for the works previously mentioned, the upscaling is performed on the basis of an arithmetic mean, which is inappropriate for the permeability for example, whereas the downscaling involves either an interpolation or a cokriging. Furthermore, all the proposed approaches are applied only to continuous petrophysical properties. They do not address the problem of matching facies models in view of facies being a discrete property.

The invention relates to a method for exploiting a geological reservoir according to an exploitation scheme defined on the basis of a reservoir model. The reservoir model is constructed and parameterized for at least two different scales, the finest-scale reservoir models (with the most mesh cells) being constrained by the coarsest-scale reservoir models (with the fewest mesh cells). Thus, the data can be integrated at different scales according to the levels of resolution involved and the constructed model is consistent in as much as the physical consistency between the fine geological models and the coarse reservoir models is preserved. Furthermore, the matching process is equally suited to continuous properties and discrete properties. The method is also economical, in as much as the number of parameters to be modified to incorporate the data can be considerably reduced relative to the number of mesh cells of the fine geological model, which brings about a significant limitation on the calls to the flow simulator and therefore a saving in terms of computation time.

SUMMARY OF THE INVENTION

The invention relates to a method for exploiting a geological reservoir according to an exploitation scheme defined on the basis of a reservoir model, the reservoir model comprising a grid associated with at least one parameter of the reservoir, in which static data are measured within the reservoir and dynamic data are acquired during exploitation. For this method, the following steps are carried out:

a) The reservoir model is constructed by the following steps:
  i) a first initial reservoir model $MR1_0$, made up of a first grid comprising $N_1$ mesh cells and at least one second initial reservoir model $MR2_0$ made up of a second grid comprising $N_2$ mesh cells, with $N_2$ being greater than $N_1$, are generated stochastically according to the static data, the stochastic generation of the second model $MR2_0$ being conditional on the generation of the first model $MR1_0$;
  ii) the second model MR2 is scaled to a simulation reservoir model which can be used by a flow simulator;
  iii) an objective function is determined that measures a deviation between the acquired dynamic data and dynamic data simulated by using the simulation reservoir model and a flow simulator;
  iv) the steps ii) and iii) are reiterated to minimize the objective function after having modified at least one of the reservoir models MR1 and MR2 and by applying the modification to the unmodified model;

b) an optimum exploitation scheme is determined for the reservoir by simulating the exploitation of the reservoir by the second reservoir model MR2 and the flow simulator; and c) the reservoir is exploited by implementing the optimum exploitation scheme.

According to the invention, the value of a parameter in a mesh cell i of the first reservoir model MR1 corresponds to the arithmetic mean of the parameter on the mesh cells of the second reservoir model MR2 that correspond to the mesh cell i of the first reservoir model MR1.

According to one embodiment of the invention, the first model $MR1_0$ is generated by a geostatistical simulator.

Alternatively, the first initial reservoir model $MR1_0$ is generated by carrying out the following steps:
  (1) a geostatistical simulator is used to generate a first version of the first initial reservoir model $MR1_0^0$ made up of a number $N_1$ of mesh cells;
  (2) an objective function is determined that measures a deviation between dynamic data acquired during exploitation and dynamic data simulated by the first reservoir model $MR1_0$ and a flow simulator; and
  (3) the step (2) is reiterated to minimize the objective function after having modified the reservoir model $MR1_0$.

Advantageously, the second reservoir model $MR2_0$ is generated knowing the first model $MR1_0$ by a geostatistical simulation incorporating cokriging, or of a Gaussian sequential simulation with cokriging, or of a joint simulations method or of an aggregating Gaussian process technique.

Furthermore, the first and second reservoir models are generated for a discrete parameter, by also using a thresholded Gaussians method or a plurigaussians method.

According to a variant embodiment of the invention, the second reservoir model $MR2_0$ is generated knowing the first reservoir model $MR1_0$ by a Gaussian sequential simulation with cokriging by carrying out the following steps:
  (1) a random path is defined for sequentially visiting all the $N_2$ mesh cells of the second grid;
  (2) a value of a parameter is assigned for each mesh cell i of the path by carrying out the following steps:
    (a) locating on the first mesh cell i of the path;
    (b) identifying the vicinity of the mesh cell i in the first $MR1_0$ and second $MR2_0$ models, and determining for each model the neighboring mesh cells in which a value of the parameter has been assigned;
    (c) determining a conditional law of probability of the parameter for the mesh cell i as a function of the values of the parameter for the neighboring mesh cells of the first $MR1_0$ and second $MR2_0$ models;
    (d) assigning a value of the parameter to the mesh cell i by a random draw from the conditional probability law; and
    (e) going on the next mesh cell of the path and repeating the steps (b) to (d).

According to a second variant embodiment of the invention, second reservoir model $MR2_0$ is generated knowing the first reservoir model $MR1_0$ by a joint simulation by carrying out the following steps:
  (1) a conditional probability law of the parameter in the second model $MR2_0$ is determined knowing the value of the parameter in the first model $MR1_0$; and
  (2) an application of the conditional law of probability is simulated by a geostatistical simulator in each mesh cell of the second grid.

According to a third variant embodiment of the invention, the second reservoir model $MR2_0$ is generated knowing the first reservoir model $MR1_0$ by an aggregating Gaussian process by carrying out the following steps:
  (1) a random variable E is defined that links the stochastic realization of a parameter for the first model $MR1_0$ to the stochastic realization of the parameter for the second model $MR2_0$;
  (2) a realization of the random variable s is simulated by a geostatistical simulator; and
  (3) for each mesh cell i of the second reservoir grid, the value of the realization of the random variable c in the mesh cell i and the value of the parameter of the first reservoir model $MR1_0$ for the mesh cell of the first grid in which the mesh cell i is included are aggregated.

Advantageously, the models are generated with discrete parameters by a thresholded Gaussian method by carrying out the following steps:
  (1) a variance of a parameter is determined in the first reservoir model $MR1_0$;
  (2) thresholds of the first reservoir model $MR1_0$ are defined as a function of the variance of the parameter;
  (3) these thresholds are applied to a continuous stochastic variable of the first reservoir model $MR1_0$; and
  (4) a thresholding is applied to values of the parameter in the second reservoir model $MR2_0$ by thresholds defined from the proportions of the parameter.

According to the invention, at least one of the reservoir models is modified by a pilot points method, or a gradual deformation method or a probability perturbation.

Preferably, at least one of the reservoir models is modified by a gradual deformation by carrying out the following steps:
  (1) in the step of generation of the reservoir models:
    (a) two sets of random numbers $Z_n^A$ and $Z_n^B$ are generated stochastically for each reservoir model n;
    (b) a deformation parameter $t_n$ is defined for each reservoir model;
    (c) each reservoir model is generated by combining the two sets of random numbers and as a function of the deformation parameter, such that: $Z_{MRn_0} = \cos(t_n) Z_n^A + \sin(t_n) Z_n^B$ with n being the index indicating the reservoir model concerned and Z corresponds to the set of the random numbers of a model, and;
  (2) in the step of modification of the reservoir models, at least one of the deformation parameters $t_n$ is modified and the reservoir models are constructed by the deformation parameter $t_n$ by applying the formula: $Z_{MRn} = \cos(t_n) Z_n^A + \sin(t_n) Z_n^B$.

Furthermore, the objective function is determined by the least squares method.

Preferably, the uncertain parameters for which the reservoir model is constructed are the facies and/or the porosity and/or the horizontal permeability and/or the vertical permeability.

Advantageously, the reservoir models are generated for different parameters by carrying out the following steps:
  (1) a random function associated with the facies is generated stochastically, as a function of static facies measurement data;
  (2) a random function associated with the porosity is generated stochastically, as a function of static porosity data and on the basis of the random facies function;
  (3) a random function associated with the horizontal permeability is generated, on the basis of the random facies and porosity functions and static permeability data;
  (4) a random function associated with the vertical permeability is generated stochastically, on the basis of the random facies, porosity and horizontal permeability functions and static permeability data.

The invention also relates to a computer program product that can be downloaded from a communication network and/or stored on a medium that can be read by computer and/or executed by a processor. It comprises program code instructions for implementing the method as described above, when the program is run on a computer.

BRIEF DESCRIPTION OF THE DRAWINGS

Other features and advantages of the method according to the invention will become apparent on reading the following description of nonlimiting exemplary embodiments, with reference to the appended figures described below.

FIGS. 3a) to 3d) represent an example of generations of models for two different scales for a continuous parameter with FIG. 3a) corresponding to the first, coarse-scale, model (with few mesh cells) and FIGS. 3b) to 3d) corresponding to three second, fine-scale, models (with a greater number of mesh cells).

FIGS. 4a) to 4d) represent an example of generation of models for two different scales for a discrete parameter with FIG. 4a) corresponds to the first, coarse-scale, model (with few mesh cells) and FIGS. 4b) to 4d) corresponding to three second, fine-scale, models (with a greater number of mesh cells).

FIGS. 5a) to 5e) illustrate second, fine-scale, reservoir models (with a greater number of mesh cells) during an update of the first, coarse-scale, reservoir model (with a small number of mesh cells) by a gradual deformation method, the deformation parameter successively taking the values 1; 0.9; 0.8; 0.7 and 0.5.

DETAILED DESCRIPTION OF THE INVENTION

The invention relates to a method for exploiting a geological reservoir which may exploit a hydrocarbon reservoir or a reservoir for storing gas (for example $CO_2$). The exploitation of the geological reservoir is carried out according to an exploitation scheme defined on the basis of a reservoir model. According to the invention, the reservoir model is made representative by a multiple-scale parameterization, that is to say parameterization with at least two reservoir models having a different number of mesh cells.

Figure 1:
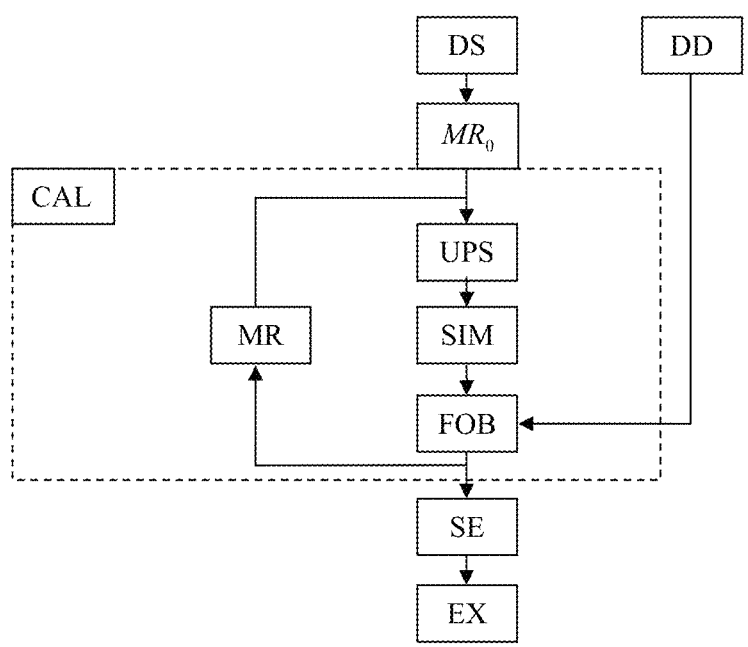
FIG. 1 illustrates the steps of the method according to a first embodiment of the invention.

FIG. 1 represents the steps of the method according to the invention. For this method, the following steps are generated:

1) Generation of the initial reservoir models ($MR_0$);
2) Matching of the reservoir models (CAL);
3) Definition of exploitation schemes (SE); and
4) Exploitation of the reservoir (EX).

Step 1) Generation of the Initial Reservoir Models ($MR_0$)

The geological formations are generally very heterogeneous environments. Modeling a reservoir, that is to say constructing a reservoir model that is representative of the reservoir, entails making use of construction methods that are stated to be "probabilistic" because of the limited amount of available information (restricted number of wells, distance between the wells, and so on). Because of this, the geological models constructed on the basis of these probabilistic methods are called "stochastic models". The construction of a stochastic reservoir model must first of all depend on the environment of the geological deposit, which makes it possible to represent the major heterogeneities which control the flow of the fluids. Integrating the static data into this model involves linear operations and can be done using geostatistical techniques that are well known to the experts.

A reservoir model, represented on a computer, has a grid with N dimensions (N>0 and generally equal to two or three) in which each of the mesh cells is assigned the value of a property characteristic of the area being studied. It may be, for example, the porosity, the permeability (horizontal or vertical) or the facies. These values form maps. Thus, a model is a grid associated with at least one map.

A property characteristic of the area being studied is represented by a random variable (V), which can be continuous or discrete. A random variable is a variable which can take a certain number of realizations according to a certain law of probability. The petrophysical properties such as saturation, porosity or permeability are associated with continuous variables, whereas the facies, of which there are a finite number, are associated with discrete variables.

The realizations of a random variable supply stochastic reservoir models. From these models, it is possible to assess the mode of operation of the underground area being studied.

In order to make the reservoir model that is to be used to define representative exploitation schemes, a multiple-scale parameterization is carried out. For this, at least two reservoir models are used, which are then called first and second reservoir models. This first model MR1 is made up of a first grid comprising $N_1$ mesh cells, whereas the second model MR2 is made up of a second grid comprising $N_2$ mesh cells, with $N_2$ being greater than $N_1$. Preferably, the mesh cells of the second grid correspond to a subdivision of the mesh cells of the first grid, and it is then possible to define $N_2=k^2N_1$ with k being a positive integer. The first model MR1 is considered to be a model on a first scale, called a course-scale model (with a reduced number of mesh cells) and the second model MR2 is considered to be a model on a second scale, called a fine-scale model (with a high number of mesh cells).

During this step, a first initial model $MR1_0$ and at least one second initial model $MR2_0$ are generated. These initial reservoir models ($MR_0$) are constructed as a function of static data (DS) measured in the reservoir. Firstly, the first initial model $MR1_0$ is generated, and then the second initial model $MR2_0$ is constrained by the first initial model $MR1_0$.

Hereinafter in the description, the index 1 is given for that which relates to the first reservoir model (so-called coarse-scale model), and the index 2 corresponds to that which relates to the second reservoir model (called fine-scale model). The second reservoir model MR2 is also called geological model.

This multiple-scale parameterization makes it possible to add modifications to the geological model at different scales according to the level of resolution of the information to be incorporated.

Advantageously, the value of a parameter on a mesh cell i of the first reservoir model $MR1_0$ corresponds to the arithmetic mean of the parameter on the mesh cells of the second reservoir model $MR2_0$ corresponding to the mesh cell i of the first reservoir model $MR1_0$.

Generally, the following approach can be adopted:
First of all, static data (diagraphies, measurements on samples taken from the wells, sismic, etc.) are measured in the field.
Then, on the basis of the static data, a second random variable V2 is defined, characterized by a covariance function (or, analogously, by a variogram), a variance and a mean. This random variable characterizes the petrophysical property considered in the second scale, called fine scale.

A first random variable V1 is defined on the basis of the arithmetic mean of the variable V2 on the mesh cells of the first grid. Since the sum of random variables is a random variable, V1 is also a random variable.

The covariance of the random variable V2 being known, the covariance of the variable V1 to the first scale, called coarse scale, and the cross-variance of V1 and V2 can be deduced therefrom.

Moreover, a set of random numbers drawn independently of one another is defined, on the one hand for the second model MR2 and on the other hand for the first model MR1: it may be, for example, a Gaussian white noise or uniform numbers. There is then an independent random number for each mesh cell of the second grid and for each mesh cell of the first grid. The numbers allocated to the first model MR1 and to the second model MR2 are respectively denoted Z1 and Z2.

From a selected geostatistical simulator, and from the set of random numbers Z1, a random draw in the random variable V1 is performed, giving access to a realization (continuous or discrete). The realization defines the trend of the variations of V2.

Finally, from a selected geostatistical simulator, from the set of random numbers Z2 and from the realization of V1 generated to the first scale, a random draw in the random variable V2 is performed, giving access to a realization (continuous or discrete) to the second scale that represents a possible image of the reservoir.

Conventionally, the random draw is done in a hierarchical framework. Firstly, the reservoir model is populated randomly by a realization of the random function associated with the facies, conditionally on the facies measurements performed on an ad hoc basis. Next, the porosity is generated randomly on each of the facies, conditionally on the porosity data obtained on the facies considered. Next, the horizontal permeability is simulated according to its associated random function, conditionally on the facies and on the porosities drawn beforehand, and on the permeability measurements performed in the field. Finally, the reservoir model is populated by a random realization of the vertical permeability conditionally on all the previous simulations and on the permeability data obtained on an ad hoc basis.

The basic principle of the method of constructing the first MR1 and second MR2 models is in first simulating a realization of V1 on the first grid, then simulating a realization of V2 on the second grid conditionally on the realization previously simulated on the first grid.

Different methods can be envisaged at this stage, including simulation techniques incorporating a cokriging to ensure the conditioning, joint simulation techniques or even aggregating Gaussian process simulation techniques. By these methods, it is possible to process continuous variables and discrete variables equally.

For Continuous Variables (Parameters)

Initially, on the first grid, a realization of the variable V1 is simulated on the basis of a selected geostatistical simulator and the set of random numbers Z1. The second step concerns the simulation of a realization of V2 conditionally on the realization generated on the first grid. The random numbers of the second grid are Z2.

According to a first variant embodiment of the invention, it is possible to apply a Gaussian sequential simulation method with cokriging. In this case, the following steps are carried out:
1) A random path is defined for sequentially visiting all the mesh cells of the second model MR2 and
2) For each mesh cell i of this path,
    a. If the mesh cell i contains a value, go directly to step b, and if the mesh cell i does not contain any value,
        i. Identify the vicinity of the mesh cell in the first and second grids and in this neighborhood, recognize the mesh cells that have known values of V2 and/or V1, possibly data deriving from the static data or from values already simulated;
        ii. Compute the mean m and the variance a of the conditional law of probability in this mesh cell u on the basis of a simple cokriging—they are denoted $m^{SCK}$ and $\sigma^{2^{SCK}}$, these values depend on the neighboring mesh cells $u_i$, $u_j$ for which the values of V1 and/or V2 are known:

$$m^{SCK}(u) = m + \sum_{i=1}^{n_i(u)} \mu_i^{SCK}(u)(V2(u_i) - m) + \sum_{j=1}^{n_j(u)} v_j^{SCK}(u)(V1(u_j) - m)$$

$$\sigma^{2SCK}(u) = \sigma^2 - \sum_{k=1}^{n_i(u)+n_j(u)} \lambda_k^{SCK}(u)B(u_k)$$

with m, μ, ν, λ the kriging weights; they are determined by minimizing the variance of the error (kriging principle).
        iii. Carry out a random draw on the basis of this conditional law of probability and of the value of Z2 associated with the mesh cell i and assign the duly generated value to the mesh cell i.
    b. Go on to the next mesh cell of the path by positing i=i+1 and repeat the step a.

FIG. 3 illustrates reservoir models obtained by this method, the variable V simulated is a Gaussian of mean 0.25, of variance 0.05 and of isotropic exponential covariance with a range of 20m. FIG. 3a) represents a first reservoir model $MR1_0$ (coarse-scale) on a 10×10 grid. FIGS. 3b) to 3d) correspond to three different realizations of V for the second reservoir model $MR2_0$ (fine-scale) on a 100×100 grid. These three realizations are conditional on the simulated realization of the first reservoir model $MR1_0$. The size of the mesh cells is respectively 1 and 10 m at the second and first scales. A check is carried out to ensure that the realizations simulated at the second scale are different from one another, but all follow the trend set by the coarse-scale realization.

According to a second variant embodiment of the invention, it is possible to make use of a joint simulation process to generate the second initial reservoir model $MR2_0$ knowing the first initial reservoir model $MR1_0$. In this case, the following steps are carried out:
1) The mean m and covariance C of V2 are computed, knowing V1, by considering that the realization V1 corresponds to the arithmetic mean of the realizations of V2 on the corresponding mesh cells.

$$m_{V2|V1} = m + C_{2,1}C_{2,2}^{-1}(V1 - m)$$

$$C_{V2|V1} = C_{2,2} - C_{2,1}C_{2,2}^{-1}C_{1,2}$$

2) A realization of this conditional law is simulated by a selected geostatistical simulator and of the set of random numbers Z2. The values of the realization are assigned to the mesh cells of the second model $MR2_0$.

According to a third embodiment of the invention, to generate the second initial reservoir model $MR2_0$ knowing the first initial reservoir model $MR1_0$, a random variable can be added to V1 that has the geostatistical properties required for the random variable resulting therefrom to have the properties of V2. This is a so-called aggregating Gaussian process method. A random variable E is thus defined, such that:

$$V2 = V1 + \epsilon$$

The mean $m_\epsilon$ and covariance $C_{\epsilon\epsilon}$ of $\epsilon$ being given by:

$$m_\varepsilon = \langle \varepsilon \rangle = 0$$

$$\begin{aligned} C_{\varepsilon\varepsilon} &= \langle \varepsilon\varepsilon \rangle \\ &= \langle (V2-V1)(V2-V1) \rangle \\ &= \langle V2V2 \rangle - 2\langle V2V1 \rangle + \langle V1V1 \rangle \\ &= C_{2,2} - 2C_{2,1} + C_{2,2} \end{aligned}$$

In this case, a realization of $\epsilon$ is simulated on the basis of a selected geostatistical simulator and of the set of random numbers Z2 and, for each mesh cell of the second grid, the realization of E in this grid and the realization of V1 already simulated for the mesh cell of the first grid corresponding to the mesh cell concerned are aggregated.

For Discrete Variables (Parameters)

The methods envisaged for the case of continuous variables can be transposed to the case of discrete variables. However, a few adaptations are necessary. It will be recalled that the variable V1 corresponds to the arithmetic mean of V2, supporting the mean corresponding to the size of the mesh cells of the first grid. In the case of the discrete variables, the realizations can take only a finite number of values such as, for example, 1, 2 or 3, which are the identifiers of a class (for example a facies). The arithmetic mean cannot be applied directly to such variables. A continuous random variable has to be used as an intermediary.

Discrete realizations can be produced, for example, using the thresholded Gaussians method. In the conventional case with a single scale, the thresholded Gaussians method first generates a standard normal continuous realization from a geostatistical simulator, then in thresholding this realization according to the proportions of the different classes present (or of the different facies present). A discrete realization (in facies) is then obtained.

In the two-scale context, a realization in facies is generated to the first scale and another is generated to the second scale which follows the trends imparted by the first-scale realization. For this, the procedure is as follows.

A first-scale continuous realization of V1 is first generated from a selected geostatistical simulator and from the set of random numbers Z1. V1 is a continuous and standard normal random variable. Then, knowing this first-scale realization, a realization of the second-scale random variable V2 (standard normal and continuous) is generated from, for example, the Gaussians sequential method with cokriging, and from the set of random numbers Z2. Reference can then be made to the thresholded Gaussians method and a thresholding applied to the first-scale realization like the second-scale realization. For the second scale, the thresholds are given by:

$$s_i = G^{-1}\left(\sum_{k=1}^{i} p_k\right)$$

where $p_i$ is the proportion of the facies i and G is the distribution function of the standard normal law. For the first scale, this formula cannot be applied directly. This is because, at this scale, the work is carried out on the mean of the second-scale continuous variable. Taking a mean implies reducing the variance. The variance is therefore computed to the first scale ($C_{1,1}(0)$) and new thresholds are defined from the inverse of the zero mean normal and from the variance $C_{1,1}(0)$.

FIG. 4 presents an exemplary application for an environment comprising 3 facies, of proportions 20%, 30% and 50%. A so-called coarse first-scale realization (FIG. 4a)) is generated with a 10×10 grid. This is then used to constrain the simulation of three so-called fine second-scale realizations (FIGS. 4b) to 4d)) with a 100×100 grid. The variogram of the second-scale continuous variable is Gaussian, isotropic, with a range of 20m. The size of the mesh cells is respectively 1 and 10m for the second grid and the first grid. The differences between these three second-scale realizations devolve, on the one hand from how the random paths for visiting the mesh cells of the grid of the second model differ, and on the other hand, from how the Gaussian white noises generated on the second grid are not the same. It is nevertheless verified that the distribution of the facies to the fine scale follows the trend set by the coarse-scale realization.

Step 2) Matching of the Reservoir Models (CAL)

At this stage, the dynamic data (DD) have not been considered for constructing the reservoir model. Dynamic data are therefore acquired during exploitation of the deposit. These are production data, well test data, drilling time data, 4D sismic data, and so on, the particular feature of which is that they vary over time as a function of the fluid flows in the reservoir.

This step is carried by measurement tools such as flow meters or sismic campaigns.

These dynamic data are then integrated into the reservoir model through an optimization or history matching (CAL). An objective function (FOB) is therefore defined which measures the deviation between the measured dynamic data (DD) measured in the field and the corresponding responses simulated (SIM) of the model concerned by a flow simulator. The flow simulators that can be used include the PumaFlow® software (IFP Énergies nouvelles, France). The aim of the optimization process is to modify this model (MR) little by little in order to minimize the objective function. For this, the steps of simulation (SIM) and of computation of the objective function are reiterated after having modified the reservoir models (MR).

Preferably, the objective function is determined by a measurement of least squares type which quantifies the deviation between data and simulated responses.

According to the invention, in order to be able to correctly simulate the flows in the reservoir, a step of upscaling (UPS) the second reservoir model MR2 to a reservoir model that is called a simulation model is carried out. The simulation model comprises a grid with fewer mesh cells than in the second reservoir model and can be used by a flow simulator in a shorter time. This notably makes it possible to reduce the time needed for the matching of the model. During the first iteration of the method, the upscaling is carried out for the second initial model $MR2_0$ and, for the other iterations, the modified second model MR2 is used as a basis. This upscaling can be carried out by any known method, for example by a so-called "numerical upscaling" method. It will be noted that the simulation model does not correspond to the first reservoir model MR1.

The modification of the reservoir models (MR1 and MR2) can relate to a single model or to both simultaneously. In the first case, if only the model MR1 is modified, the other model MR2 is re-updated conditionally on the modification made by retaining the relationships between the first MR1 and second MR2 reservoir models. Preferably, for this modification, the method according to the invention uses geostatistical deformation methods like the pilot points, or gradual deformation or the probability perturbation methods to modify the maps (associated with the reservoir model) to one of the scales being considered.

For example, for the gradual deformation method, the following steps can be carried out:

During the step of generation of the reservoir models
a) two sets of random numbers are generated on the first grid $Z1^A$ and $Z1^B$;
b) two sets of random numbers are generated on the second grid $Z2^A$ and $Z2^B$;
c) a first-scale deformation parameter t1 is defined and the combination $Z1=\cos(t1)*Z1^A+\sin(t1)*Z1^B$ is computed;
d) a second-scale deformation parameter t2 is defined and the combination $Z2=\cos(t2)*Z2^A+\sin(t2)*Z2^B$, is computed with Z2 and Z1 being the sets of random numbers used to generate the realizations of the variables V2 and V1 which make it possible to assign petrophysical properties to the reservoir model;

During the step of modification of the reservoir models
a) at least one of the deformation parameters is modified (t1 only, or t2 only, or both simultaneously) and Z1 and Z2 are recomputed.

An example of gradual deformation applied to the coarse scale is illustrated by FIG. 5. This FIG. 5 represents the variations of the second model MR2 when the first deformation parameter t1 is made to vary. For this example, t1 successively takes the values 1 (FIG. 5a)), 0.9 (FIG. 5b)), 0.8 (FIG. 5c)), 0.7 (FIGS. 5d)) and 0.5 (FIG. 5e)). In these figures, the trend of the model as a function of the deformation parameter can be noted.

By virtue of the minimum of the objective function, the second reservoir model, which is the most representative, is determined.

Step 3) Definition of Exploitation Schemes (SE)

On the basis of the reservoir model determined in the preceding steps, a number of exploitation schemes (SE) corresponding to different possible configurations of exploitation of the underground reservoir can be determined involving placement of the producing and/or injecting wells, target values for the flow rates per well and/or for the reservoir, the types of tools used, the fluids used, injected and/or recovered, and so on. For each of these schemes, the production predictions should be determined after the matching period. These probabilistic production predictions are obtained by flow simulation software (preferably the same as that used previously) as well as by the matched reservoir numerical model.

One or more possible exploitation schemes (SE) are defined that are suited to the reservoir model (also called a geological model with respect to the second reservoir model MR2). For each of these schemes, the responses are determined by simulation.

Based on the probabilistic production predictions defined for each exploitation scheme (preceding step), comparison is used to choose the exploitation scheme which is most relevant. For example:
- by comparing the maximum of the recovered oil volume, it is possible to determine the production scheme that is likely to provide the maximum recovery or be the most cost effective;
- by comparing the standard deviation of the recovered oil volume, it is possible to determine the production scheme with the least risk.

Step 4) Exploitation of the Reservoir (EX)

The reservoir is then exploited according to the defined exploitation scheme (EX), for example by drilling new wells (producing or injecting), by modifying the tools used, by modifying the flow rates and/or the nature of fluids injected, and so on.

The invention also relates to a computer program product that can be downloaded from a communication network and/or stored on a medium that can be read by computer and/or executed by a processor. This program comprises program code instructions for implementing the method as described above, when the program is run on a computer.

Alternative Embodiment

Figure 2:
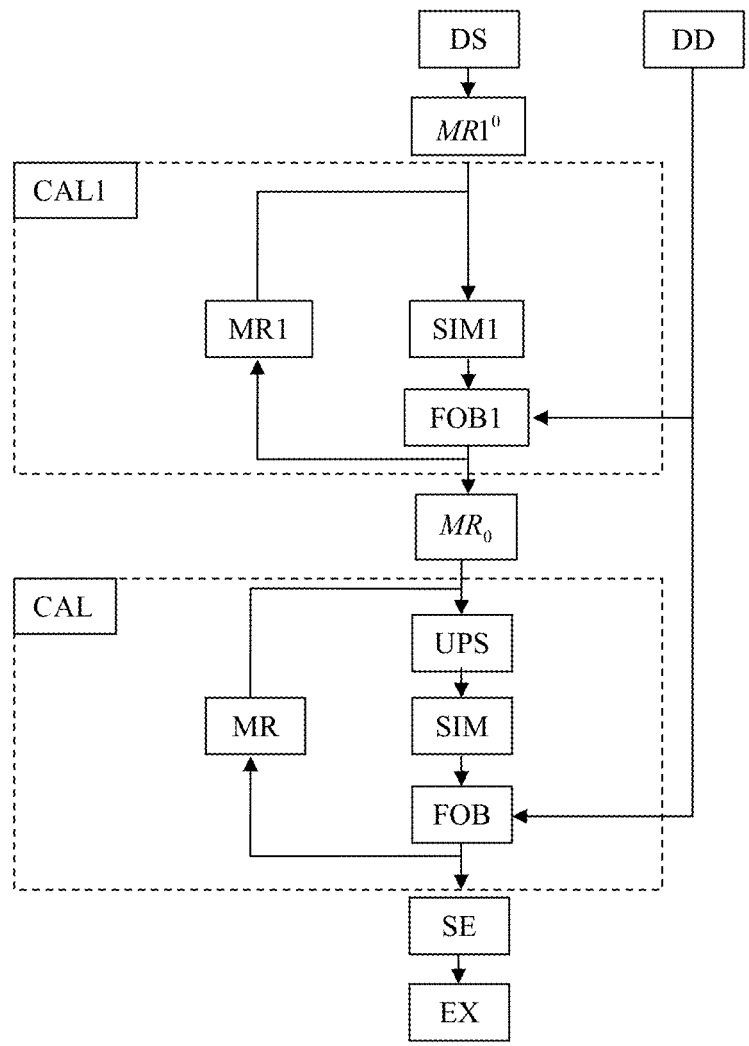
FIG. 2 illustrates the steps of the method according to a second embodiment of the invention.

FIG. 2 represents a second embodiment of the invention. In this figure, the steps that are identical to the first embodiment and retain the same abbreviations. This embodiment differs from the previous one in that the first initial reservoir model is constructed by a first history matching (CAL1). For this first matching, the following steps are carried out:

a) a first version of the first initial reservoir model $MR1_0^0$ is generated stochastically)($MR1^0$) as a function of static data by a geostatistical simulator, this first version also comprising $N_1$ mesh cells;
b) dynamic data are simulated (SIM1) by the first initial model $MR1_0$ and of a flow simulator;
c) a first objective function (FOB1) is determined that measures a deviation between dynamic data (DD) acquired during exploitation and simulated dynamic data (SIM1) and preferably, the least squares method is chosen to determine the objective function; and
d) the two preceding steps are reiterated to minimize the objective function after having modified (MR1) the first initial reservoir model $MR1_0$ and preferably, this model is modified with a pilot points method or a gradual deformation method or a probability perturbation method.

From this first initial reservoir model $MR1_0$, at least one second initial reservoir model $MR2_0$ is generated conditionally on the first initial model $MR1_0$ in a manner similar to the step 1) of the first embodiment. Then, the steps 2) to 4) of the first embodiment are carried out in the same way as has been described above.

This embodiment makes it possible to perform a fast first-scale (coarse) matching in order to then be able to select initial models that are of greater benefit than a randomly simulated model. The result of this is a saving in time and performance during the second matching.

The invention claimed is:

1. A method for exploiting a geological reservoir according to an exploitation scheme defined by a reservoir model, the reservoir model comprising a grid associated with at least one parameter of the reservoir, in which static data are measured within the reservoir and dynamic data are acquired during exploitation, comprising:

a) constructing the reservoir model by:
   i) providing a first initial reservoir model, including a first grid comprising a number $N_1$ of mesh cells and at least one second initial reservoir model including a second grid comprising a number $N_2$ of mesh cells, with $N_2$ being greater than $N_1$, generated stochastically according to the static data, the stochastic generation of the second model being conditional on the generation of the first model;
   ii) scaling the second model to a simulation reservoir model which is usable by a flow simulator;
   iii) determining an objective function measuring a deviation between the acquired dynamic data and dynamic data simulated by the simulation reservoir model and a flow simulator;
   iv) reiterating the steps ii) and iii) to minimize the objective function after modification of at least one of the first and second reservoir models and by applying the modification to an unmodified model of the first and second reservoir models;
b) determining an optimum exploitation scheme for the reservoir by simulating the exploitation of the reservoir by the second reservoir model and the flow simulator; and
c) exploiting the reservoir by implementing the optimum exploitation scheme.

2. A method according to claim 1, wherein a value of a parameter in a mesh cell i of the first reservoir model corresponds to the arithmetic mean of the parameter on the mesh cells of the second reservoir model that correspond to the mesh cell i of the first reservoir model wherein;
i designates one individual mesh cell of the models.

3. A method according to claim 1, wherein the first model is generated by a geostatistical simulator.

4. A method according to claim 2, wherein the first model is generated by a geostatistical simulator.

5. A method according to claim 1, wherein the first initial reservoir model is generated by:
   (1) using a geostatistical simulator to generate a first version of the first initial reservoir model made up of a number $N_1$ of mesh cells;
   (2) determining an objective function between dynamic data acquired during exploitation and dynamic data simulated by the first reservoir model and a flow simulator; and
   (3) reiterating step (2) to minimize the objective function after modification of the first reservoir model.

6. A method according to claim 2, wherein the first initial reservoir model is generated by:
   (1) using a geostatistical simulator to generate a first version of the first initial reservoir model made up of a number $N_1$ of mesh cells;
   (2) determining an objective function between dynamic data acquired during exploitation and dynamic data simulated by the first reservoir model and a flow simulator; and
   (3) reiterating step (2) to minimize the objective function after modification of the first reservoir model.

7. A method according to claim 1, wherein the second reservoir model is generated with knowledge of the first model by a geostatistical simulation incorporating one of a cokriging, a Gaussian sequential simulation with cokriging, joint simulations or an aggregating Gaussian process.

8. A method according to claim 2, wherein the second reservoir model is generated with knowledge of the first model by a geostatistical simulation incorporating one of a cokriging, a Gaussian sequential simulation with cokriging, joint simulations or an aggregating Gaussian process.

9. A method according to claim 3, wherein the second reservoir model is generated with knowledge of the first model by a geostatistical simulation incorporating one of a cokriging, a Gaussian sequential simulation with cokriging, joint simulations or an aggregating Gaussian process.

10. A method according to claim 4, wherein the second reservoir model is generated with knowledge of the first model by a geostatistical simulation incorporating one of a cokriging, a Gaussian sequential simulation with cokriging, joint simulations or an aggregating Gaussian process.

11. A method according to claim 5, wherein the second reservoir model is generated with knowledge of the first model by a geostatistical simulation incorporating one of a cokriging, a Gaussian sequential simulation with cokriging, joint simulations method or an aggregating Gaussian process.

12. A method according to claim 7, wherein the first and second reservoir models are generated for a discrete parameter, by using a thresholded Gaussians method or a plurigaussians method.

13. A method according to claim 8, wherein the first and second reservoir models are generated for a discrete parameter, by using a thresholded Gaussians method or a plurigaussians method.

14. A method according to claim 9, wherein the first and second reservoir models are generated for a discrete parameter, by using a thresholded Gaussians method or a plurigaussians method.

15. A method according to claim 10, wherein the first and second reservoir models are generated for a discrete parameter, by using a thresholded Gaussians method or a plurigaussians method.

16. A method according to claim 11, wherein the first and second reservoir models are generated for a discrete parameter, by using a thresholded Gaussians method or a plurigaussians method.

17. A method according to claim 7, wherein the second reservoir model is generated with knowledge of the first reservoir model using of a Gaussian sequential simulation with cokriging by carrying out the following steps:
   (1) defining a random path for sequentially visiting all the $N_2$ mesh cells of the second grid;
   (2) assigning a value of a parameter for each mesh cell i of a path by:
      (a) locating on the first mesh cell i of the path;
      (b) identifying a vicinity of the mesh cell i in the first and second models and determining for each model mesh cells in a vicinity in which a value of the parameter has been assigned;
      (c) determining a conditional law of probability of the parameter for the mesh cell i as a function of values of the parameter for mesh cells in a vicinity of the first model and second model;
      (d) assigning a value of the parameter to the mesh cell i by a random draw from the conditional law of probability; and
      (e) going on the next mesh cell of the path and repeating the steps (b) to (d).

18. A method according to claim 8, wherein the second reservoir model is generated with knowledge of the first reservoir model using of a Gaussian sequential simulation with cokriging by carrying out the following steps:

(1) defining a random path for sequentially visiting all the $N_2$ mesh cells of the second grid;
(2) assigning a value of a parameter for each mesh cell i of a path by:
   (a) locating on the first mesh cell i of the path;
   (b) identifying a vicinity of the mesh cell i in the first and second models and determining for each model mesh cells in a vicinity in which a value of the parameter has been assigned;
   (c) determining a conditional law of probability of the parameter for the mesh cell i as a function of values of the parameter for mesh cells in a vicinity of the first model and second model;
   (d) assigning a value of the parameter to the mesh cell i by a random draw from the conditional law of probability; and
   (e) going on the next mesh cell of the path and repeating the steps (b) to (d).

19. A method according to claim 9, wherein the second reservoir model is generated with knowledge of the first reservoir model using of a Gaussian sequential simulation with cokriging by carrying out the following steps:
(1) defining a random path for sequentially visiting all the $N_2$ mesh cells of the second grid;
(2) assigning a value of a parameter for each mesh cell i of a path by:
   (a) locating on the first mesh cell i of the path;
   (b) identifying a vicinity of the mesh cell i in the first and second models and determining for each model mesh cells in a vicinity in which a value of the parameter has been assigned;
   (c) determining a conditional law of probability of the parameter for the mesh cell i as a function of values of the parameter for mesh cells in a vicinity of the first model and second model;
   (d) assigning a value of the parameter to the mesh cell i by a random draw from the conditional law of probability; and
   (e) going on the next mesh cell of the path and repeating the steps (b) to (d).

20. A method according to claim 10, wherein the second reservoir model is generated with knowledge of the first reservoir model using of a Gaussian sequential simulation with cokriging by carrying out the following steps:
(1) defining a random path for sequentially visiting all the $N_2$ mesh cells of the second grid;
(2) assigning a value of a parameter for each mesh cell i of a path by:
   (a) locating on the first mesh cell i of the path;
   (b) identifying a vicinity of the mesh cell i in the first and second models and determining for each model mesh cells in a vicinity in which a value of the parameter has been assigned;
   (c) determining a conditional law of probability of the parameter for the mesh cell i as a function of values of the parameter for mesh cells in a vicinity of the first model and second model;
   (d) assigning a value of the parameter to the mesh cell i by a random draw from the conditional law of probability; and
   (e) going on the next mesh cell of the path and repeating the steps (b) to (d).

21. A method according to claim 11, wherein the second reservoir model is generated with knowledge of the first reservoir model using of a Gaussian sequential simulation with cokriging by carrying out the following steps:

(1) defining a random path for sequentially visiting all the $N_2$ mesh cells of the second grid;
(2) assigning a value of a parameter for each mesh cell i of a path by:
   (a) locating on the first mesh cell i of the path;
   (b) identifying a vicinity of the mesh cell i in the first and second models and determining for each model mesh cells in a vicinity in which a value of the parameter has been assigned;
   (c) determining a conditional law of probability of the parameter for the mesh cell i as a function of values of the parameter for mesh cells in a vicinity of the first model and second model;
   (d) assigning a value of the parameter to the mesh cell i by a random draw from the conditional law of probability; and
   (e) going on the next mesh cell of the path and repeating the steps (b) to (d).

22. A method according to claim 12, wherein the second reservoir model is generated with knowledge of the first reservoir model using of a Gaussian sequential simulation with cokriging by carrying out the following steps:
(1) defining a random path for sequentially visiting all the $N_2$ mesh cells of the second grid;
(2) assigning a value of a parameter for each mesh cell i of a path by:
   (a) locating on the first mesh cell i of the path;
   (b) identifying a vicinity of the mesh cell i in the first and second models and determining for each model mesh cells in a vicinity in which a value of the parameter has been assigned;
   (c) determining a conditional law of probability of the parameter for the mesh cell i as a function of values of the parameter for mesh cells in a vicinity of the first model and second model;
   (d) assigning a value of the parameter to the mesh cell i by a random draw from the conditional law of probability; and
   (e) going on the next mesh cell of the path and repeating the steps (b) to (d).

23. A method according to claim 13, wherein the second reservoir model is generated with knowledge of the first reservoir model using of a Gaussian sequential simulation with cokriging by carrying out the following steps:
(1) defining a random path for sequentially visiting all the $N_2$ mesh cells of the second grid;
(2) assigning a value of a parameter for each mesh cell i of a path by:
   (a) locating on the first mesh cell i of the path;
   (b) identifying a vicinity of the mesh cell i in the first and second models and determining for each model mesh cells in a vicinity in which a value of the parameter has been assigned;
   (c) determining a conditional law of probability of the parameter for the mesh cell i as a function of values of the parameter for mesh cells in a vicinity of the first model and second model;
   (d) assigning a value of the parameter to the mesh cell i by a random draw from the conditional law of probability; and
   (e) going on the next mesh cell of the path and repeating the steps (b) to (d).

24. A method according to claim 14, wherein the second reservoir model is generated with knowledge of the first reservoir model using of a Gaussian sequential simulation with cokriging by carrying out the following steps:

(1) defining a random path for sequentially visiting all the $N_2$ mesh cells of the second grid;
(2) assigning a value of a parameter for each mesh cell i of a path by:
  (a) locating on the first mesh cell i of the path;
  (b) identifying a vicinity of the mesh cell i in the first and second models and determining for each model mesh cells in a vicinity in which a value of the parameter has been assigned;
  (c) determining a conditional law of probability of the parameter for the mesh cell i as a function of values of the parameter for mesh cells in a vicinity of the first model and second model;
  (d) assigning a value of the parameter to the mesh cell i by a random draw from the conditional law of probability; and
  (e) going on the next mesh cell of the path and repeating the steps (b) to (d).

25. A method according to claim 15, wherein the second reservoir model is generated with knowledge of the first reservoir model using of a Gaussian sequential simulation with cokriging by carrying out the following steps:
(1) defining a random path for sequentially visiting all the $N_2$ mesh cells of the second grid;
(2) assigning a value of a parameter for each mesh cell i of a path by:
  (a) locating on the first mesh cell i of the path;
  (b) identifying a vicinity of the mesh cell i in the first and second models and determining for each model mesh cells in a vicinity in which a value of the parameter has been assigned;
  (c) determining a conditional law of probability of the parameter for the mesh cell i as a function of values of the parameter for mesh cells in a vicinity of the first model and second model;
  (d) assigning a value of the parameter to the mesh cell i by a random draw from the conditional law of probability; and
  (e) going on the next mesh cell of the path and repeating the steps (b) to (d).

26. A method according to claim 16, wherein the second reservoir model is generated with knowledge of the first reservoir model using of a Gaussian sequential simulation with cokriging by carrying out the following steps:
(1) defining a random path for sequentially visiting all the $N_2$ mesh cells of the second grid;
(2) assigning a value of a parameter for each mesh cell i of a path by:
  (a) locating on the first mesh cell i of the path;
  (b) identifying a vicinity of the mesh cell i in the first and second models and determining for each model mesh cells in a vicinity in which a value of the parameter has been assigned;
  (c) determining a conditional law of probability of the parameter for the mesh cell i as a function of values of the parameter for mesh cells in a vicinity of the first model and second model;
  (d) assigning a value of the parameter to the mesh cell i by a random draw from the conditional law of probability; and
  (e) going on the next mesh cell of the path and repeating the steps (b) to (d).

27. A method according to claim 7, in which the second reservoir model is generated with knowledge of the first reservoir model by a joint simulation by:

(1) determining a conditional law of probability of the parameter in the second model with knowledge of the value of the parameter in the first model; and
(2) an application of the conditional law of probability is simulated by a geostatistical simulator in each mesh cell of the second grid.

28. A method according to claim 12, in which the second reservoir model is generated with knowledge of the first reservoir model by a joint simulation by:
(1) determining a conditional law of probability of the parameter in the second model with knowledge of the value of the parameter in the first model; and
(2) an application of the conditional law of probability is simulated by a geostatistical simulator in each mesh cell of the second grid.

29. A method according to claim 7, in which the second reservoir model is generated with knowledge of the first reservoir model by aggregating Gaussian process technique comprising:
(1) defining a random variable $\epsilon$ linking the stochastic realization of a parameter for the first model to the stochastic realization of the parameter for the second model;
(2) simulating a realization of the random variable $\epsilon$ by a geostatistical simulator; and
(3) aggregating for each mesh cell i of the second reservoir grid, the value of a realization of the random variable $\epsilon$ in said mesh cell i and a value of the parameter of the first reservoir model for the mesh cell of the first grid in which the mesh cell i is included.

30. A method according to claim 12, in which the second reservoir model is generated with knowledge of the first reservoir model by aggregating Gaussian process technique comprising:
(1) defining a random variables linking the stochastic realization of a parameter for the first model to the stochastic realization of the parameter for the second model;
(2) simulating a realization of the random variables by a geostatistical simulator; and
(3) aggregating for each mesh cell i of the second reservoir grid, the value of a realization of the random variable $\epsilon$ in the mesh cell i and a value of the parameter of the first reservoir model for the mesh cell of the first grid in which the mesh cell i is included.

31. A method according to claim 12, wherein the models are generated with discrete parameters by the thresholded Gaussians method by:
(1) determining the variance of a parameter in the first reservoir model;
(2) defining thresholds of the first reservoir model as a function of the variance of the parameter;
(3) applying thresholds to a continuous stochastic variable of the first reservoir model; and
(4) applying a thresholding to values of the parameter in the second reservoir model by thresholds defined from the proportions of the parameter.

32. A method according to claim 1, wherein at least one of the reservoir models is modified by one of a pilot points method, a gradual deformation method or of a probability perturbation method.

33. A method according to claim 2, wherein at least one of the reservoir models is modified by one of a pilot points method, a gradual deformation method or of a probability perturbation method.

34. A method according to claim 3, wherein at least one of the reservoir models is modified by one of a pilot points method, a gradual deformation method or of a probability perturbation method.

35. A method according to claim 5, in which at least one of the reservoir models is modified by one of a pilot points method, a gradual deformation method or of a probability perturbation method.

36. A method according to claim 7, in which at least one of the reservoir models is modified by one of a pilot points method, a gradual deformation method or of a probability perturbation method.

37. A method according to claim 12, in which at least one of the reservoir models is modified by one of a pilot points method, a gradual deformation method or of a probability perturbation method.

38. A method according to claim 17, in which at least one of the reservoir models is modified by one of a pilot points method, a gradual deformation method or of a probability perturbation method.

39. A method according to claim 26, in which at least one of the reservoir models is modified by one of a pilot points method, a gradual deformation method or of a probability perturbation method.

40. A method according to claim 29, in which at least one of the reservoir models is modified by one of a pilot points method, a gradual deformation method or of a probability perturbation method.

41. A method according to claim 31, in which at least one of the reservoir models is modified by one of a pilot points method, a gradual deformation method or of a probability perturbation method.

42. A method according to claim 32, in which at least one of the reservoir models is modified by a gradual deformation method comprising:
(1) in the step of generation of the reservoir models by
    (a) generating two sets of random numbers $Z_n^A$, $Z_n^B$ stochastically for each reservoir model n;
    (b) defining a deformation parameter $t_n$ for each reservoir model;
    (c) generating each reservoir model by combining the two sets of random numbers and as a function of the deformation parameter, with: $Z_{MR_{n_0}} = \cos(t_n)Z_n^A + \sin(t_n)Z_n^B$ with n being the index indicating the reservoir model concerned and Z corresponding to a set of the random numbers of a model, and;
(2) in modification of the reservoir models, at least one of the deformation parameters $t_n$ is modified and the reservoir models are constructed by the deformation parameter $t_n$ by applying the formula: $Z_{MR_n} = \cos(t_n) Z_n^A + \sin(t_n) Z_n^B$ and wherein, and wherein,
    A and B are used to differentiate the first and second sets of random numbers of each reservoir model and n equals 1 or 2 so that $MR_{n_0}$ corresponds to the first or second initial reservoir model and $MR_n$ corresponds to the first or second reservoir model.

43. A method according to claim 1, comprising:
determining the objective function by a least squares method.

44. A method according to claim 43, comprising:
constructing the reservoir model with uncertain parameters which are at least one of the facies, porosity, horizontal permeability and vertical permeability.

45. A method according to claim 44, in which the reservoir models are generated for different parameters by:
(1) associating a random function with facies generated stochastically, as a function of static facies measurement data;
(2) associating a random function with the porosity which is generated stochastically, as a function of static porosity data and based on the random facies function;
(3) associating a random function associated with the horizontal permeability on a basis of the random facies, porosity functions and static permeability data; and
(4) generating a random function with vertical permeability which is generated stochastically, on the basis of the random facies, porosity and horizontal permeability functions and static permeability data.

46. A computer program product for at least one of downloading from at least one of a communication network, a non-transitory storage medium which is readable by computer for execution by a processor performing the steps, comprising:
a) constructing a reservoir model by:
    i) providing a first initial reservoir model, including a first grid comprising a number $N_1$ of mesh cells and at least one second initial reservoir model including a second grid comprising a number $N_2$ of mesh cells, with $N^2$ being greater than $N_1$, generated stochastically according to the static data, the stochastic generation of the second model being conditional on the generation of the first model;
    ii) scaling a second reservoir model to a simulation reservoir model which is usable by a flow simulator;
    iii) determining an objective function measuring a deviation between the acquired dynamic data and dynamic data simulated by the simulation reservoir model and a flow simulator;
    iv) reiterating the steps ii) and iii) to minimize the objective function after modification of at least one of the reservoir models and by applying the modification to an unmodified model;
b) determining an optimum exploitation scheme for the reservoir by simulating the exploitation of the reservoir by the second reservoir model and the flow simulator; and
c) exploiting the reservoir by implementing the optimum exploitation scheme.

* * * * *